United States Patent [19]

Dandliker et al.

[11] 4,252,442
[45] Feb. 24, 1981

[54] ADJUSTING METHOD AND APPARATUS FOR POSITIONING PLANAR COMPONENTS

[75] Inventors: René Dandliker, Oberrohrdorf; Otto Lanz, Niederrohrdorf, both of Switzerland

[73] Assignee: BBC Brown, Boveri & Company Limited, Baden, Switzerland

[21] Appl. No.: 26,650

[22] Filed: Apr. 3, 1979

[30] Foreign Application Priority Data

May 22, 1978 [CH] Switzerland ............... 5552/78

[51] Int. Cl.³ .................................. G01B 11/26
[52] U.S. Cl. ................... 356/400; 250/550; 356/363
[58] Field of Search ......... 356/354, 355, 356, 363, 356/399, 400, 401, 375; 250/550

[56] References Cited

U.S. PATENT DOCUMENTS

| | | | |
|---|---|---|---|
| 3,811,779 | 5/1974 | Jacobs et al. | 356/400 |
| 3,915,576 | 10/1975 | Taylor | 356/400 |

Primary Examiner—Richard A. Rosenberger
Attorney, Agent, or Firm—Oblon, Fisher, Spivak, McClelland & Maier

[57] ABSTRACT

A method and apparatus for mutually adjusting the positioning of planar, generally transparent components such as for example, small liquid-crystal plates. The plates are provided with marks specially structured to diffract incident collimated light, in a shape or direction which is characteristic for each plate. By means of a convergent lens, characteristic diffraction images produced by passing light through the marks are depicted on a detector located in the image plane of the convergent lens. The respective characteristic images of the marks are stopped down individually by means of a diaphragm located in the lens focal plane. The diaphragm can periodically be closed partially, so that control signals for the electronic displacement of each plate can be derived individually from the particular positions of the images of the marks on the detector, corresponding to the positions of the plates.

11 Claims, 5 Drawing Figures

ADJUSTING METHOD AND APPARATUS FOR POSITIONING PLANAR COMPONENTS

BACKGROUND OF THE INVENTION

1. Field of the Invention

The present invention relates to an adjusting device and method for adjusting the relative positioning of planar, generally transparent components, such as liquid crystal plates.

2. Description of the Prior Art

In the industrial manufacture of diverse types of apparata, such as, for example, watches, cameras, microscopes and the like, it is frequently necessary to adjust planar, frequently completely transparent, components relative to one another by machine, that is to say without human intervention. Thus, for example, when the planar components which are to be adjusted relative to one another are liquid-crystal displays, two small glass plates with optically transparent electrode structures applied thereto must be aligned relative to one another.

In some known liquid-crystal displays, for example, rectangular small glass plates having edge lengths of 10 to 30 mm are processed as the components which are to be adjusted. These plates having electrode patterns which have been vapour-deposited as a largely transparent layer and which have been etched, are to be made congruent to an accuracy of about 10 $\mu$m. Since the accuracy of the break in the glass is insufficient, the electrode patterns are not in a defined position relative to the edge of the glass so that an adjustment to a limit stop cannot meet the set requirements. The almost transparent layers which serve as the electrodes are accessible to direct measurement techniques only with difficulty. For technological reasons, the provision of additional reference points, for example by imprints and the like, with a defined position relative to the geometry of the electrodes is impossible.

In the adjusting devices hitherto used, specially structured, etched zones are provided as marks on the small glass plates which are to be adjusted. The applied special structuring effects a local phase modulation of the light so that even completely transparent layers give a detectable signal in an optical dark field. Since the marks consist of parts of the same layer, from which the electrodes have also been produced, they have the same thickness as the electrodes. In the adjusting devices hitherto used, this fact does not yet raise particular problems since the components to be adjusted in this case are envisaged as glasses having electrode layer thicknesses of about 1,200 Å.

For various reasons, such as price, invisibility and the like, electrode layer thicknesses of about 300 Å are specifically desired in the construction of electro-optical displays, such as say liquid-crystal displays, so that serious problems arise, which cannot be solved with the adjusting devices hitherto used. Since the optical phase variation is then smaller by a factor of 4, the intensity available for the detection of the marks is reduced by a factor of about 20, and this gives an unsatisfactory signal/noise ratio in the adjusting devices hitherto used.

SUMMARY OF THE INVENTION

Accordingly it is the object of the present invention to provide a novel adjusting device and processes for operating such an adjusting device, whereby it is possible to adjust components which are provided with marks formed of thin layers, even as thin as 300 Å thickness, that is to say an adjusting device, by means of which an adjustment can be carried out even with the aid of such thin mark layers without difficulty and with the requisite accuracy.

These and other objects are achieved according to the invention by providing a novel apparatus for adjusting the positioning of plural planar components, each of which are provided with at least one structured mark, which includes a light source for illuminating the component structured marks with colliminated light, a convergent lens, a disphragm located in the focal plane of the lens, and at least one detector located in the image plane of the lens. The components to be adjusted are located in an object plane of the lens with the structured marks thereof on an optical axis between the light source and the detector, or on an axis parallel to the optical axis. The marks of respective planar components are structured differently to produce characteristic diffraction images corresponding to the respective planar components. These diffraction images for the marks of different components may, for example, have different shapes in the focal plane of the lens or may exhibit different directionality. The diaphragm in the lens focal plane is provided with plural apertures, selected groups of which can be selectively covered, to produce the selected characteristic diffraction images corresponding to particular planar components, which diffraction images are detecting by the detector, with the respective components adjusted based on the respective diffraction image.

Various mark structures are possible, but in one preferred embodiment the marks of the various planar components have the same regular grid structure but are oriented at a common angle with respect to each other. For example, if two components are to be adjusted, the associated marks of each component are oriented with a relative angle of 90° therebetween.

The marks of a preferred embodiment have a layer of thickness of at most 600 Å.

The apparatus and method of the invention advantageously enables the economical manufacture of display elements having very thin and hence very inexpensive electrodes, which reduces the price, and results in improved quality of the display.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
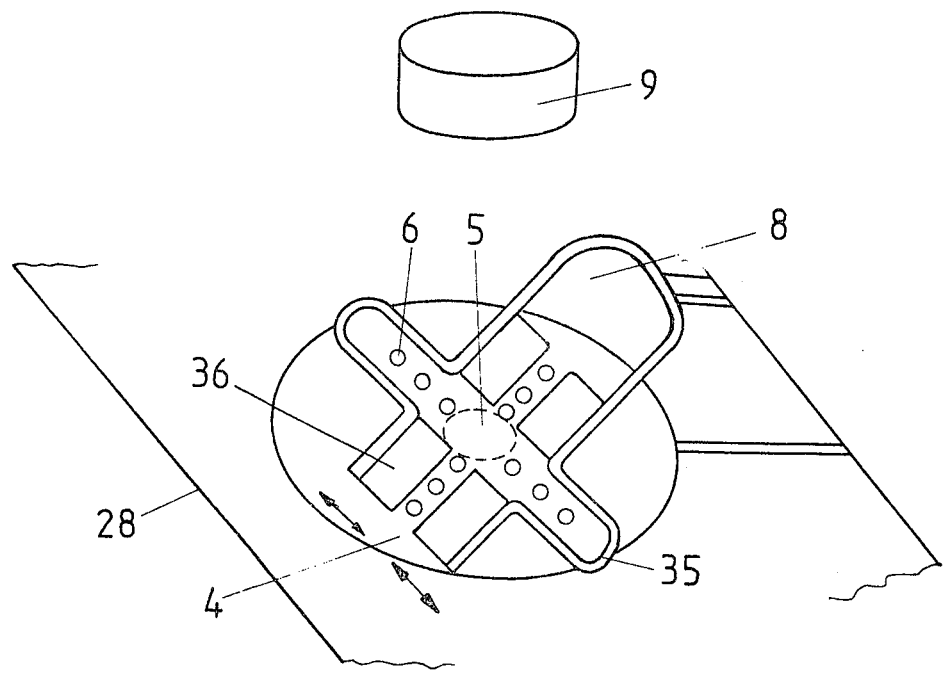
FIG. 1 is a diagrammatic perspective overall representation of the most important elements of an illustrative embodiment of the adjusting apparatus according to the invention.

Referring now to the drawings, wherein like reference numerals designate identical or corresponding parts throughout the several views, and more particularly to FIG. 1 thereof, the adjusting apparatus according to the invention is seen to include a light source 7 which irradiates two rectangular plates, the components 1, 2 which are to be adjusted, with an adequately parallel light beam. The two plates 1, 2 are each provided with a mark 10 and 11 respectively, on which a part of the light beam coming from the light source 7 is diffracted. The mark 10, 11 of each plate 1, 2 has a structure which is indicated here by diagonal lines and by means of which the light incident on the individual mark 10, 11 is diffracted in each case into a direction which is characteristic for the mark 10, 11 and hence plate 1, 2 concerned. The light then passes through the convergent lens 3 to the diaphragm 4 in the focal plane 28 of the convergent lens 3.

The diaphragm 4 in FIG. 1 consists of a circular metal disc in which apertures 6 are provided. The opaque area enclosed by the dashed circular line has the function of a dark field diaphargm 5. The light beams, which the diaphragm 4 has allowed to pass through the apertures 6, corresponding to the diffraction images produced by the marks 10 or 11, reach the detector 9 which is located in the image plane and with the aid of which the incident beams are electrically evaluated.

The functioning of an adjusting device according to the invention is now be explained in detail by the example of an adjusting device according to FIG. 1.

Firstly, the light source 7 is switched on, and the plates 1, 2 which are to be adjusted are then placed, perpendicular to the light beam emergent from the light source 7, into a holder device(not shown) which is provided for this purpose. The placing of the plates into a position perpendicular to the light beams is in general carried out automatically with the aid of, for example, a mechanical gripper device. When the plates 1, 2 have been placed, they are then only displaceable in the plane fixed by the x, y coordinates x', y' coordinates shown in FIG. 1. For simplicity's sake only one mark 10 or 11 is drawn in each case on the plates 1,2 in FIG. 1. These marks have the shape of a rectangle with the long side perpendicular to the x or x' coordinate This gives an example of two marks which are suitable for adjusting in the direction of the x axis or x' axis.

Figure 2:
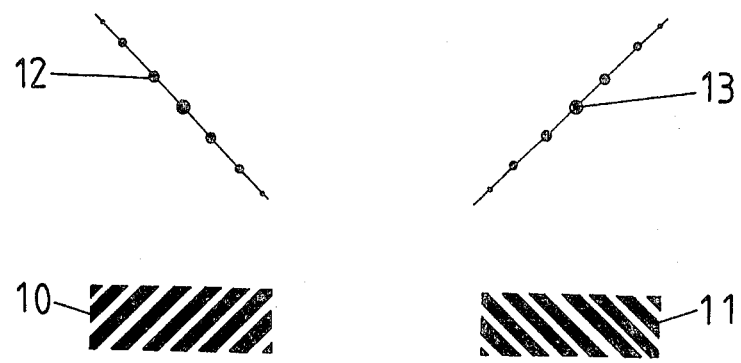
FIG. 2 is a plan view of an illustrative embodiment of two marks having mark structures of different alignment and a plan view of diffraction images in the focal plane, which correspond to these marks, according to the invention.

If the diaphragm 4 in FIG. 1 had approximately only the shape and size of the opaque area which acts as the dark field diaphragm 5 and is limited by the dashed circular line, only more or less overlapping images of the marks 10 or 11 could appear on the detector 9, and their relative position could not be individually established by the detector 9. To establish the individual component positions, the diaphragm 4 in FIG. 1 is provided with a shutter device 8 by means of which the apertures 6 of the diaphragm 4 can be closed row by row. In FIG. 1, for example, the row of the apertures 6 can be closed corresponding to the diffraction image of the mark 10. With the diaphragm 4 shown and the shutter device 8, a separation of images of the marks 10 or 11 on a detector 9 can be achieved since each individual mark 10 or 11 is provided with mutually perpendicular grid structures, and this has the effect that the diffraction images produced in the focal plane do not overlap. The structure which is indicated in FIG. 1 by diagonal lines on the marks and is shown enlarged in FIG. 2, gives a row of dots as the diffraction image in the focal plane 28. If the marks 10 or 11 of the plates 1 or 2 respectively are now provided with such mark structures which are twisted relative to one another by an angle of 90°, two rows of dots offset by 90° also result in the focal plane 28, as can be seen from FIG. 2, one of which rows can, as shown in FIG. 1, be stopped down by the shutter device 8. Thus, the image of this one mark 10 on the detector 9 then also disappears. The two plates 1, 2 are accurately adjusted in the direction concerned whenever they give one and the same signal on the detector. This is achieved by an electronically controlled displacement of the plates 1, 2 into the direction concerned. During the displacement, one row of apertures 6 in the diaphragm 4 is periodically closed by the shutter device 8. It is thus possible to determine the position of the images of the corresponding marks 10, 11 on the detector 9 independently of one another by synchronous detection and to derive from this the control signals for the displacement of the plates 1 or 2.

The closing of one row of dots is effected, as indicated in FIG. 1, by electrically moving the arms 35 of the shutter device 8 towards one another so that the flat parts 36 on the ends of the arms 35 completely overlap. If different mark structures are used, which effect other diffraction figures in the focal plane, the diaphragm 4 must of course be shaped corresponding to the particular diffraction figures. Moreover, if more than two plates 1, 2, say three plates, are adjusted relative to one another, it is possible, for example, to provide each plate with a mark, the grid structures of which form an angle of 60° in each case with the grid structures of the adjacent plate. Alternatively, other mark structures can be used, by which the diffraction figures in the focal plane 28 can be distinguished as an unique or characteristic form. In each case, a number of diffraction figures can then be detected, which corresponds to the number of the plates to be adjusted and which differ in their form and/or direction depending on the structure of the marks.

The further FIGS. 2 to 5 are representations of important details of an adjusting device according to FIG. 1.

As an example, FIG. 2 shows two marks 10, 11 in plan view, and one mark can be imagined to be on one of the plates 10, 11 and the other mark can be imagined to be on the other plate. Together, these marks 10, 11 represents two rectangular grids, the structures of which form an angle of 90° with one another. As shown in FIG. 2, the marks 10, 11 each effect, in the focal plane 28, a row of dots 12, 13, which in turn form an angle of 90° with one another. Using the diaphragm 4 located in the focal plane 28 of the convergent lens 3, as drawn in FIG. 1, the image of one or both marks 10, 11 can now be depicted on the detector 9 in accordance with the position of the diaphragm 4 and the shutter device 8 and the images can thus be compared with one another. The apertures 6 are provided in the focal plane 28 in order to let the diffraction figures in the form of dots pass through.

Figure 3:
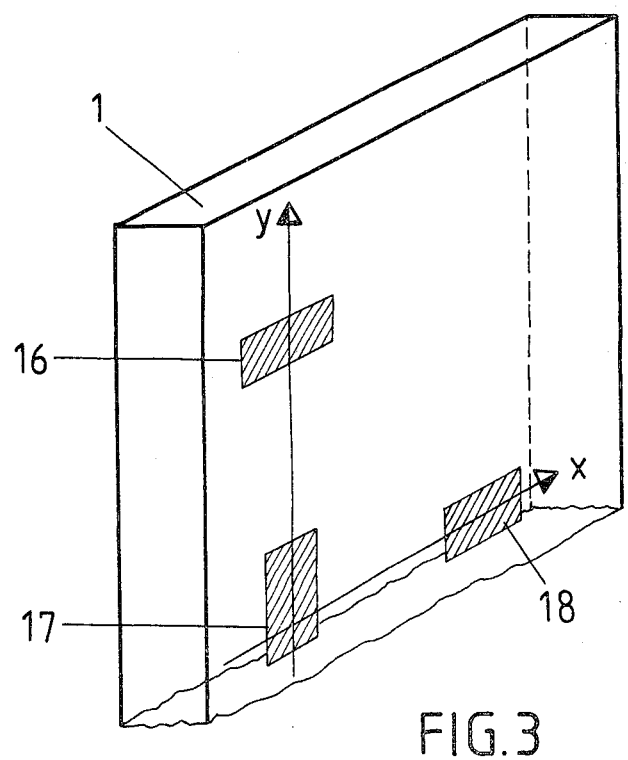
FIG. 3 is a schematic illustration of a component which is provided with three possible marks for adjusting the component in the x, y plane.

FIG. 3 illustrates another embodiment in which a component 1, which is to be adjusted, is provided with marks 16, 17, 18 in order to fix the component 1 in the x, y plane shown. The mark 16 here serves for adjusting in the y direction, the mark 17 serves for adjusting in the x direction and the mark 18 serves for fixing the rotational position.

Figure 4:
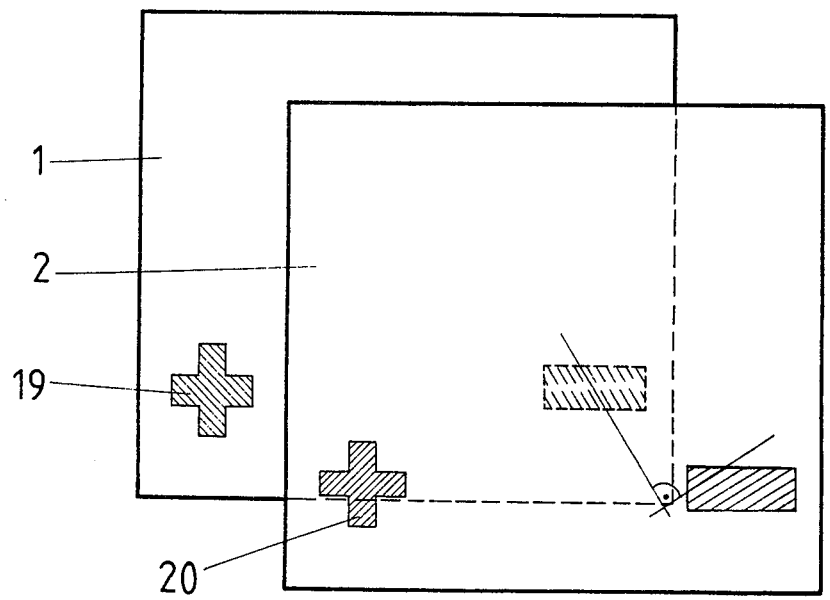
FIG. 4 is a schematic plan view of two components which are to be adjusted and which are each provided with two possible marks.

FIG. 4 is an illustrative plan view of two plates as the components 1, 2 which are to be adjusted, and mutually corresponding marks 19 and 20 or 18 and 21 respectively. The marks 17 or 16 required for the displacement in the x direction or y direction respectively are here integrated into a combined mark 19 or 20. It can be clearly seen how the grid structures of the corresponding marks form an angle of 90° with one another. It is also possible to select other angles, and this is advantageous particularly when adjusting more than two components 1, 2.

Figure 5:
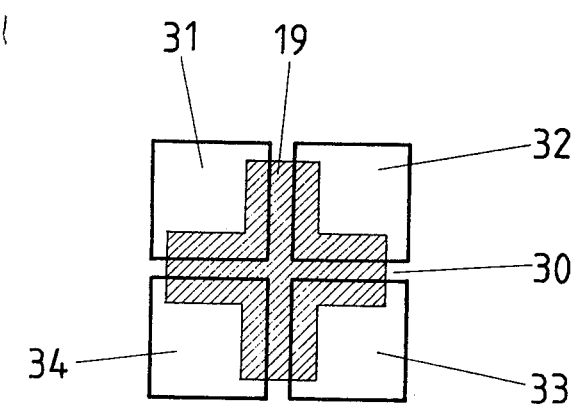
FIG. 5 is a schematic plane view of a 4-quadrant detector with a cruciform mark projected thereon.

Finally, FIG. 5 represents an example of a specially advantageous photo-detector, a so-called 4-quadrant detector 30, by means of which it is possible to adjust two plates 1, 2, which are each provided with one mark 19, 20, in the x direction and y direction. With the shape of the mark selected as in FIG. 5, proper positioning is achieved whenever the image portions of the mark have the same size on all the quadrants 31, 32, 33, 34.

To recapitulate, since the marks 10, 11, 16 to 21 consist of an optically transparent material, these structures represent a phase grid. The image of the phase grid can be rendered visible when a part of the diffraction orders, in particular the zero order, is stopped down. Advantageouly, the diaphragm 4 is designed in such a way that it passes only the light beams in the desired diffraction orders of the phase grid of the marks 10, 11,16 to 21. Undesired light beams arising from faults, such as air occulsions in the plates, scratches, edges of the electrodes, grains of dust and the like, are thus largely suppressed and the signal-to-noise ratio is thus improved.

It can be seen from FIG. 3 that, for completely fixing the plates, marks 18 are also required which serve for adjusting in the sense of a rotation about the marks 19 or 20. With the selection of the marks, made in FIG. 4, a total of only two small zones on the plates 1, 2 must thus be illuminated for adjusting the two plates 1, 2. This can be effected by a single division of the light beam between the light source 7 and the plates 1, 2 which are to be adjusted, and this can very readily be technically accomplished. The light source 7 advantageously is a low-power laser (1-10 mW).

the partial covering of the diaphragm 4 can be accomplished in very diverse ways. For example, if the covering is accomplished mechanically, a rotary segment disc, a torsional vibrator or translational elements, such as, for example, slides, tuning fork vibrators and the like, can be used for this purpose. The shutter device selected in FIG. 1 can be a tuning fork vibrator. The periodical covering of the apertures 6 in the diaphragm 4 at a frequency of, for example, 400 Hz can be carried out without difficulty, using a tuning fork vibrator of this type.

If the covering is accomplished by means of a Kerr cell or Pockels cell, a polarizer must be provided between the light source 7 and the detector (9) and analyzers must be provided in the focal plane 28.

If the shutter device used in the focal plane 28 is a scattering cell, a suitable ferro-electric switch obviously is, for example, a ferro-optical ceramic device (ITT) or a liquid-crystal cell.

Reference is now made to further important advantages of the adjusting apparatus according to the invention. By means of the apparatus according to the invention, one and the same detector 9 can be used for the mutually corresponding marks of the two plates 1, 2 which are to be adjusted. In this way, the influences of non-uniformities of the detectors 9 and the drift of the amplifiers are virtually eliminated. Faults due to dust particles, scratches and the like have approximately the same effect in adjusting the two plates 1, 2, and this is tantamount to an improvement in precision.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for adjusting the relative position of plural planar components, said plural components each provided with at least one mutually mark having a predetermined structure, using a light source, a convergent lens, a diaphragm located in a focal plane of said lens, and a detector an optical axis, comprising:

providing said diaphragm with plural groups of apertures, each group corresponding to a characteristic diffraction image produced by a corresponding at least one mark;

periodically covering a selected group of said apertures;

determining the position of a respective component by means of the diffraction image of that component as passed through the selected group of apertures to said detector independently of the particular position of the characteristic diffraction image produced by the mark of the other component; and deriving control signals to implement particular displacements of the individual components from the individual positions of the respective diffraction images of the marks produced on the detector.

2. A method for adjusting the relative position of plural planar components which comprise the steps of:

providing an optical apparatus which includes a convergent lens, a source of collimated light located along an optical axis of said lens, a diaphragm located in the focal plane of said lens, and a photoelectric detector located in the image plane of said lens;

providing each of said plural planar components with at least one mutually corresponding mark having a predetermined structure, said predetermined structure of each mark having a different configuration from the structure of each mutually corresponding mark, each mark acting to diffract light rays passing therethrough such that a diffraction pattern is produced which is characteristic to the particular mark;

locating said plural components in the object plane of said convergent lens along an optical axis at least parallel to an optical axis between said light source and said lens, said diaphragm and said detector respectively such that light from said light source is passed through each of said marks and is diffracted thereby, said diffracted light being passed through said lens to said diphragm and to said detector, each of said marks producing a diffraction pattern which is separated from the diffraction pattern produced by the other marks at the focal plane of said lens;

deriving control signals from the output of said detector, said control signals corresponding to the relative positions of said plural planar components; and adjusting the relative position of said plural planar components in response to the control signals from said detector;

wherein said diaphragm located in the focal plane of said lens includes a plurality of groups of apertures, said groups of apertures being arranged such that said diaphragm acts as a dark field diaphragm, each group of apertures corresponding to the characteristic diffraction pattern produced by one of said marks, said diaphragm further including means for covering selected groups of apertures such that selected diffraction patterns may be prevented from reaching said detector.

3. A method for adjusting the relative position of plural planar components as recited in claim 2, wherein:

each of said at least one mutually corresponding marks includes a regular grid structure; and the grid structure of said at least one mark associated with a planar component is formed at an angle of 90° to the grid structure of the mutually corresponding at least one mark of another component.

4. A method for adjusting the relative position of plural planar components as recited in claim 3, wherein:

at least two rectangular-shaped marks are provided on each of said plural planar components, each of said two marks having a longitudinal axis oriented 90° with respect to the longitudinal axis of the other of said two marks.

5. A method for adjusting the relative position of plural planar components as recited in claim 4, wherein:

said at least two marks are combined to form a single cross-shaped mark.

6. A method for adjusting the relative position of plural planar components as recited in claims 4 or 5, wherein:

the relative positions of said plural components are adjusted by moving said components in the directions defined by said longitudinal axes of said at least two rectangular-shaped marks.

7. A method for adjusting the relative position of plural planar components as recited in claim 2, wherein:

each of said at least one marks is a grid-structured rectangle.

8. A method for adjusting the relative position of plural planar components as recited in claim 2, wherein said detector comprises:

a 4-quadrant detector element.

9. A method for adjusting the relative position of plural planar components as recited in claim 2, wherein:

said plural planar components are the glass plates of a liquid crystal display device; and said glass plates include electrode layers, said marks being made from the same material as said electrode layers, said marks having a thickness of less than 600 Angstrom units.

10. A method for adjusting the relative position of plural planar components as recited in claim 2, which further comprises the steps of:

adjusting the position of a first planar component in response to the control signals from said detector;

covering a selected group of apertures in said diaphragm such that said characteristic diffraction pattern for said first component is prevented from reaching said detector; and adjusting the position of a second planar component in response to the control signals from said detector.

11. A method for adjusting the relative position of plural planar components as recited in claim 2, wherein:

the relative position of said plural components is adjusted by periodically covering selected groups of apertures in said diaphragm such that the characteristic diffraction patterns for each component are periodically prevented from reaching the detector, and by locally shifting said components towards each other until the control signal for each component indicates that said components are in alignment.

* * * * *